United States Patent [19]
Jeddeloh

[11] Patent Number: 5,933,852
[45] Date of Patent: Aug. 3, 1999

[54] SYSTEM AND METHOD FOR ACCELERATED REMAPPING OF DEFECTIVE MEMORY LOCATIONS

[75] Inventor: Joseph Jeddeloh, Minneapolis, Minn.

[73] Assignee: Micron Electronics, Inc., Nampa, Id.

[21] Appl. No.: 08/744,958

[22] Filed: Nov. 7, 1996

[51] Int. Cl.$^6$ ................................................ G06F 11/16
[52] U.S. Cl. .................... 711/153; 711/103; 711/105; 711/153; 711/204; 711/205
[58] Field of Search ........................ 711/103, 104, 711/105, 153, 156, 147, 202, 203, 206, 207

[56] References Cited

U.S. PATENT DOCUMENTS

| | | | |
|---|---|---|---|
| 4,980,822 | 12/1990 | Brantley, Jr. et al. | 364/200 |
| 5,530,960 | 6/1996 | Parks et al. | 395/825 |
| 5,802,551 | 9/1998 | Komatsu et al. | 711/103 |

Primary Examiner—John W. Cabeca
Assistant Examiner—David Ransom
Attorney, Agent, or Firm—Seed and Berry LLP

[57] ABSTRACT

A computer system includes a memory requester that interfaces with a memory module that includes memory portions. A remapping table that maps each of the defective memory portions to a respective non-defective memory portion in the memory module is created and then stored. Also, a usage table that maps each of a subset of the defective memory portions to a respective non-defective memory portion is created and stored. The defective memory portions of the subset are selected based on which defective memory portions have been most recently used, i.e., requested. In response to receiving from the memory requester a request for access to a requested memory portion of the memory module, a determination is made whether the requested memory portion is one of the defective memory portions mapped in the usage table or remapping table. The non-defective memory portion to which the requested memory portion is mapped in either the usage table or the remapping table is accessed if the requested memory portion is defective, and the requested memory portion is accessed if the requested memory portion is not defective.

25 Claims, 2 Drawing Sheets

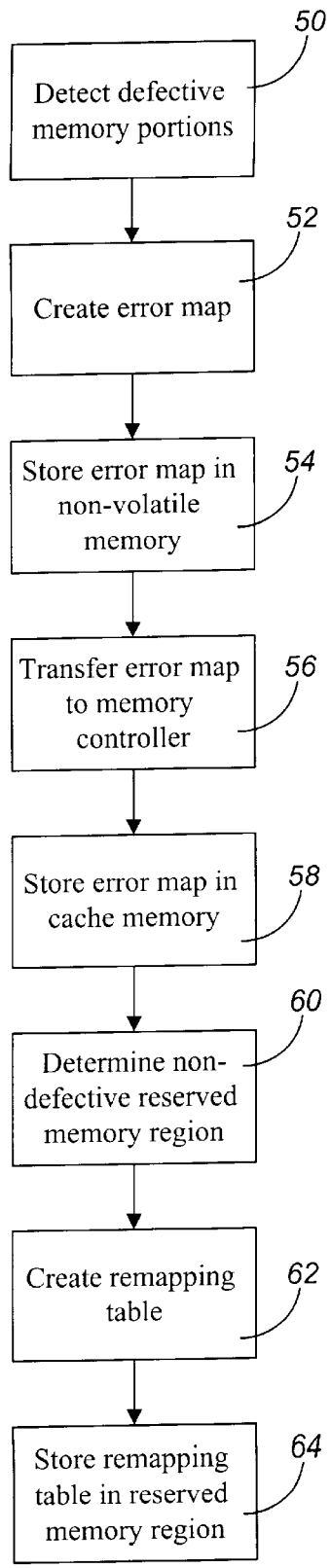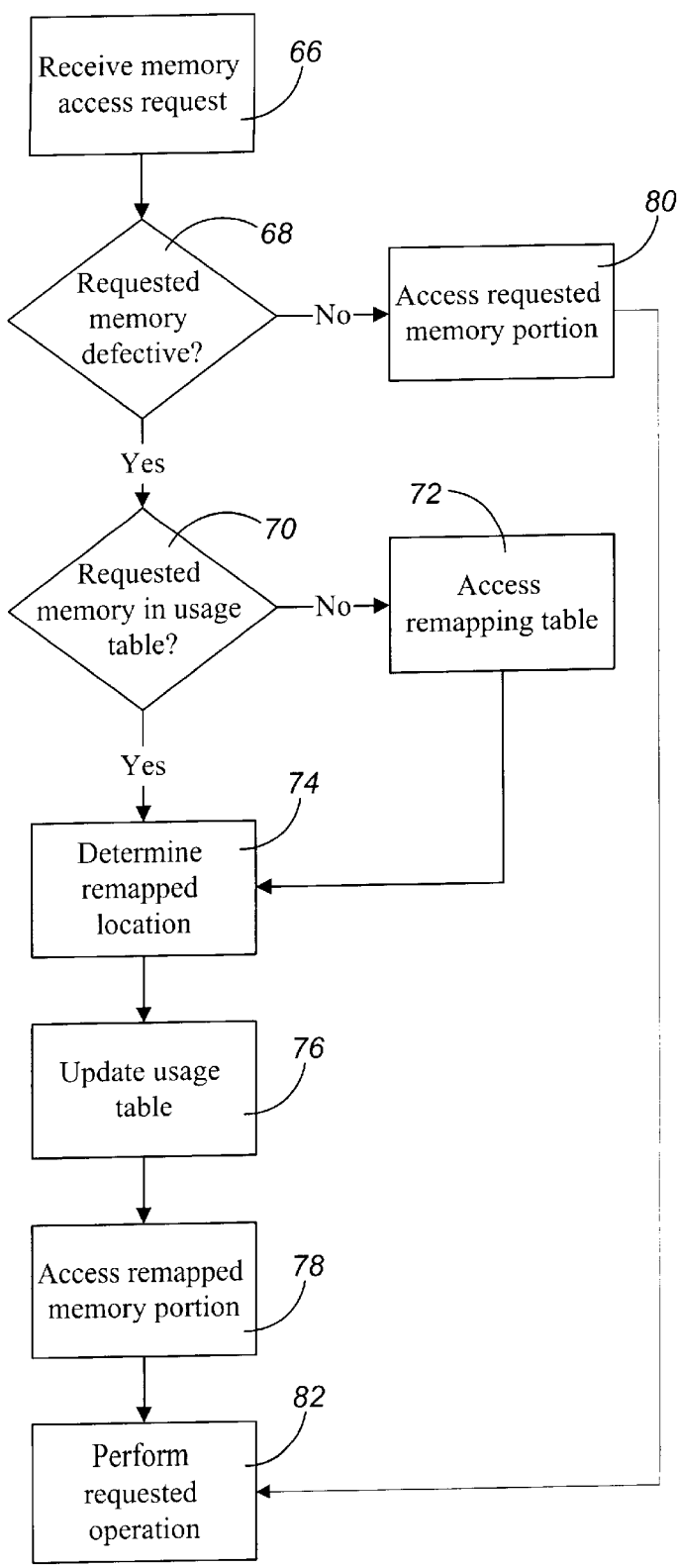
Fig. 2
Fig. 3

SYSTEM AND METHOD FOR ACCELERATED REMAPPING OF DEFECTIVE MEMORY LOCATIONS

TECHNICAL FIELD

The present invention relates to computer memory, and more particularly, to overcoming defective memory locations.

BACKGROUND OF THE INVENTION

Substantially all modern electronic computers rely on semiconductor memory to store data for processing by a central processing unit (CPU). Such computers employing semiconductor memory vary from simple computers, such as those contained in telephone answering machines, to highly complex supercomputers employed for complicated scientific projects. In simple computers like those used for telephone answering machines, errors in one or more of the memory locations of the memory may not be fatal. For example, a mistake in the memory of the telephone answering machine likely would only cause the synthesized voice stored on the memory to be imperceptibly altered. However, one or more defective memory locations in a memory of a computer used to perform scientific calculations may cause substantial problems.

Although current manufacturing techniques have substantially reduced the number of defective memory locations, excessive numbers of defective memory locations are still produced during fabrication of computer memory. Those defective memory locations can be caused by any of numerous steps taken during manufacture of the memory chips, semiconductor crystalinity defects, electrical connector discontinuities, etc. Although memory chips with such defective memory locations typically represent a small portion (less than 1%) of the total number of memory chips produced, the actual number of such defective memory chips is substantial. In the past, extra rows of memory cells, known as "redundant rows" were provided that could be used to replace rows having defective memory cells. While the use of redundant rows is often successful in salvaging otherwise defective memory chips, the number of defective rows that can be replaced is limited to the number of redundant rows that are provided on the memory chip. The number of defective rows sometimes exceeds the number of redundant rows, thus preventing repair of some defective rows. In some cases, such defective memory chips could be sold at a greatly reduced price for applications that do not require perfect memory, such as for telephone answering machines. However, it would be beneficial if some of those memory chips could be employed in more critical applications, such as in personal computers.

One way to enable such defective memory chips to be incorporated into personal computers would be to employ error correction schemes to compensate for defective memory locations. Error correction schemes add to each data word plural error correction bits that enable the data word to be reconstituted in the event of an erroneous data bit within the data word. However, such prior art error correction schemes typically only reconstitute a data word if only a single bit of the data word is erroneous. Moreover, such software error correction schemes add several extra data bits to each data word which results in high memory overhead. In addition, such error correction schemes could be extended to detect multiple erroneous data bits, but the memory overhead that would result likely would be unacceptable.

SUMMARY OF THE INVENTION

A preferred embodiment of the present invention is directed to a method and computer system for interfacing a memory requester with a memory module that includes defective memory portions. A remapping table is created and stored for mapping each of a first set of the defective memory portions to a non-defective memory portion in the memory module so that the non-defective memory portion is accessed when the defective memory portion is requested. A usage table is also created and stored for mapping each of a second set of the defective memory portions to a respective non-defective memory portion in the memory module. The defective portions of the second set are selected based on usage of the defective memory portions during a recent period. Preferably, the defective memory portions of the second set are selected based on which of the defective memory portions have been most recently used. The first set of defective memory portions preferably includes all of the defective memory portions, but may include only the defective memory portions that are not in the second set.

In response to receiving from the memory requester a request for access to a requested memory portion of the memory module, a determination is made from the usage table whether the requested memory portion is one of the defective memory portions of the second set. If the error map indicates that the requested memory portion is one of the defective memory portions of the second set, then the non-defective memory portion to which the requested memory portion is mapped is determined from the usage table. Preferably, the usage table is stored in a high-speed register array so that the non-defective memory portions associated with the defective memory portions of the second set can be determined and accessed quickly. If the requested memory portion is defective but not in the second set, then the non-defective memory portion to which the requested memory portion is mapped is determined from the remapping table. The non-defective memory portion is accessed if the requested memory portion is one of the defective memory portions, and the requested memory portion is accessed if the requested memory portion is not one of the defective memory portions. In providing the ability to access a non-defective memory portion when a defective memory portion is requested, the preferred embodiment of the invention enables memory modules with defective memory locations to be employed in error-sensitive computer applications. Moreover, by mapping a subset of the defective memory portions in the usage table, the preferred embodiment provides very fast access without requiring the entire remapping table to be stored in expensive SRAM or flip-flops.

BRIEF DESCRIPTION OF THE INVENTION

FIG. 2 is a flow diagram showing steps used to remap defective memory locations of a memory module according to a preferred embodiment of the present invention.

FIG. 3 is a flow diagram showing how a memory access request is processed according to a preferred embodiment of the present invention.

DETAILED DESCRIPTION OF THE INVENTION

Figure 1:
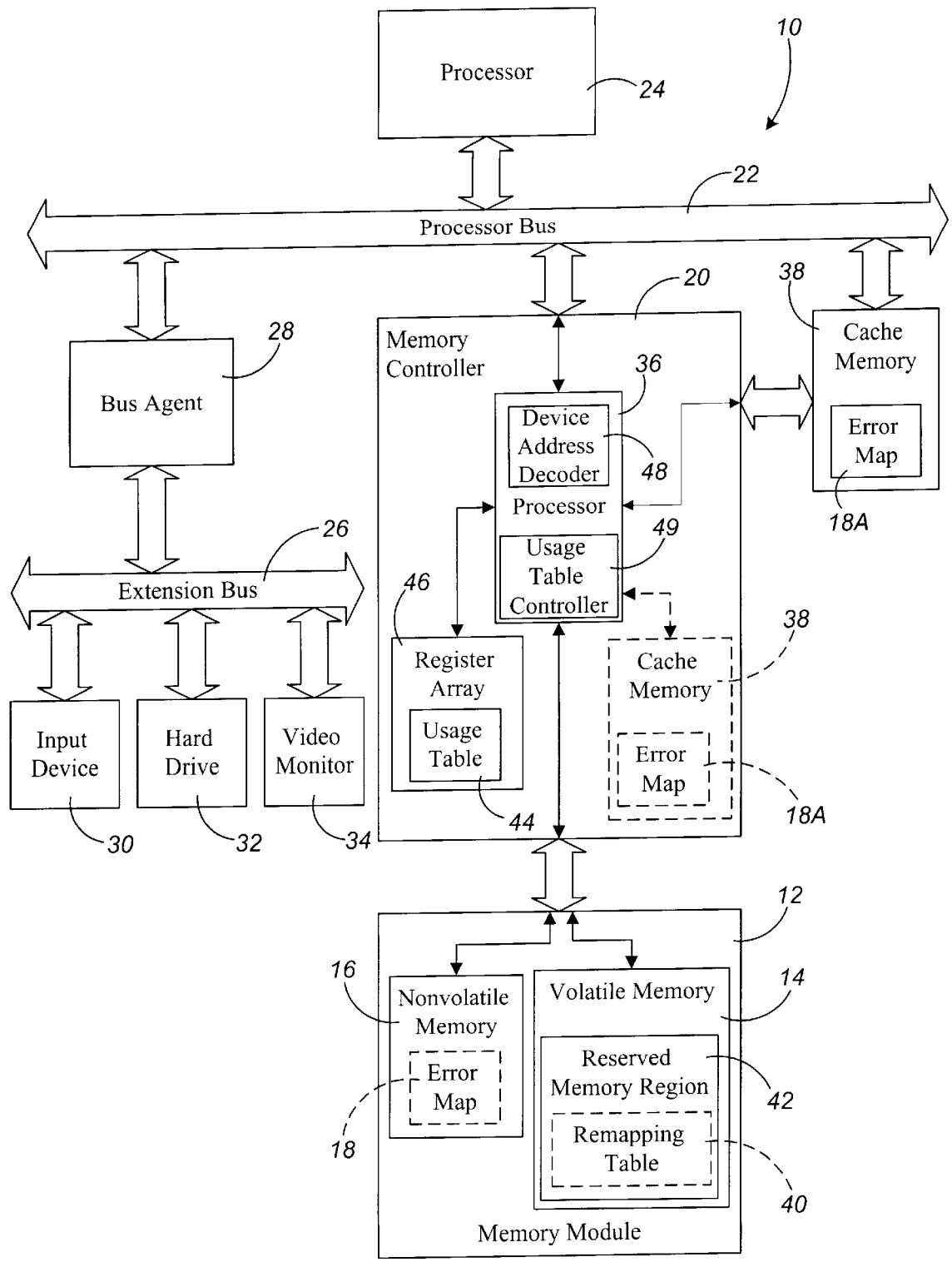
FIG. 1 is a block diagram of a computer system for remapping defective memory locations of a memory module according to a preferred embodiment of the present invention.

A computer system 10 for servicing memory access requests directed to a memory module 12 is shown in FIG. 1. The memory module 12 can be any of numerous types of memory modules, such as a double in-line memory module (DIMM). The memory module 12 includes a volatile memory block 14 that includes numerous volatile memory locations. The volatile memory block 14 preferably includes one or more dynamic random access memory (DRAM) chips, but the invention is equally applicable for other types of volatile memory, such as static random access memory (SRAM). The volatile memory block 14 may include one or more defective volatile memory portions in addition to numerous non-defective volatile memory portions. In contrast to prior art memory modules, the memory module 12 includes a nonvolatile memory block 16 that stores an error map 18. The error map 18 includes, for each of the defective volatile memory portions of the volatile memory block 14, an error tag that indicates that the volatile memory portion is defective. The nonvolatile memory block 16 can be composed of any type of semiconductor nonvolatile memory, such as erasable programmable read only memory (EPROM) and electrically erasable programmable read only memory (EEPROM).

Preferably, the error map 18 is created in the factory that makes the volatile memory block 14 based on well-known tests that determine which memory portions of the volatile memory block 14 are defective. In one embodiment, every single memory location is tested to determine whether it is defective, and if so, an error tag is created for the defective memory location. In another embodiment, larger memory portions, such as four kilobyte groups of memory locations, are tested to determine whether any locations in each of the four kilobyte memory portions are defective. Accordingly, as used herein, the term "memory portion" refers broadly to either a single memory location or a group of plural memory locations.

The memory module 12 interfaces with the remainder of the computer system 10 via a memory controller 20 and a processor bus 22 to a computer processor 24. As is typical, the computer system 10 also includes an extension bus 26 that is coupled to the processor bus 22 by a bus agent 28. Coupled to the extension bus 26 are an input device 30, such as a keyboard, mouse, or electronic pen/tablet, a hard drive 32 and a video monitor 34. The hard drive 32 in effect, is a nonvolatile memory device that stores data and computer instructions that are processed by the computer processor 24 after the data and computer instructions are transferred to the volatile memory block 14 of the memory module 12.

When the computer system 10 is turned ON, a processor 36 in the memory controller 20 retrieves a copy 18A of the error map 18 from the nonvolatile memory block 16 of the memory module 12. The memory controller processor 36 stores the error map 18A in a cache memory 38, which typically will be a nonvolatile memory device such as DRAM or SRAM. Alternatively, the cache memory 38 could be a nonvolatile memory device, such as an EEPROM, to enable the error map 18A to be permanently stored in the cache memory. However, such nonvolatile memory devices usually are much slower than volatile memory devices. The cache memory 38 can be separate from the memory controller 20 and coupled directly to the processor 22 as shown by solid lines in FIG. 1 or the cache memory 38 can be integrated in the memory controller 20 as shown by dashed lines in FIG. 1.

As discussed above, the error map 18 includes an error tag for each of the defective volatile memory potions of the volatile memory block 14. Preferably, the error map 18 is implemented by associating an error tag with each defective volatile memory portion and a non-error tag for each non-defective volatile memory portion. For example, the error tag may be a tag bit of a first logic value, such as 0, if the memory portion is defective and the non-error tag may be a tag bit of a second logic value, such as 1, if the memory portion is not defective. Alternatively, the error map 18 can simply include the addresses of the defective memory portions such that the addresses not listed are assumed to be non-defective.

In response to receiving the copy 18A of the error map 18 from the nonvolatile memory block 16 of the memory module 12, the memory controller processor 36 creates a remapping table 40. The remapping table 40 maps each of the defective memory portions to a memory portion of the volatile memory block 14 that is known to be non-defective. In other words, for each defective memory portion of the volatile memory block 14, the remapping table 40 includes an index that points to a non-defective memory portion of the volatile memory 14. Preferably, the memory controller processor 36 stores the remapping table 40 in a non-defective memory portion of the volatile memory block 14. Alternatively, the memory controller processor 36 could store the remapping table 40 in the cache memory 38. However, the amount of storage space available in the cache memory 38 is likely to be limited while much more space is likely to be available in the volatile memory block 14 of the memory module 12.

The memory portions to which the defective memory portions are being mapped preferably are located in a reserved memory region 42 of the volatile memory block 14 that cannot be directly accessed by the system processor 24. Further, the remapping table 40 preferably is also stored in the reserved memory region 42. By protecting the reserved memory region 42 from direct access by the system processor 24, the computer system 10 prevents memory access conflicts that would occur if the system processor 24 could overwrite the memory portions that are occupied by the remapping table or by the memory portions to which the defective memory portions are mapped. The memory controller processor 36 can protect the reserved area of the volatile memory 14 by not allowing the operating system of the system processor 24 to use the reserved memory region 42.

After the error map 18 and the remapping table 40 are stored in the appropriate locations in cache memory 38 and the volatile memory block 14, respectively, the memory module 12 and the memory controller 20 are ready to receive requests for access to the memory portions of the volatile memory block 14. The memory controller 20 receives from the system processor 24 via the processor bus 22 a request for access to a requested memory portion of the memory module 12. The memory controller processor 36 responds by determining from the error map 18A of the memory cache 38 whether the requested memory portion is one of the defective memory portions. If the error map 18A indicates that the requested memory portion is not one of the defective memory portions, then the memory controller processor 36 simply accesses the requested memory portion from the volatile memory block 14. If the error map 18A indicates that the requested memory portion is one of the defective memory portions, then the memory controller processor 36 accesses the remapping table 40 stored in the volatile memory block 14. The memory controller processor 36 determines from the remapping table 40 the non-defective memory portion to which the requested memory portion is mapped. Further, the memory controller processor 36 accesses the non defective memory portion determined from the remapping table 40 and performs the function requested by the memory access request. For example, if the memory access request was a request to read data from the requested memory portion, then the memory controller processor 36 reads the data from the non-defective memory portion to which the requested memory portion is mapped and returns the data to the system processor 24 via the computer bus 22.

Although the number of defective volatile memory portions typically is a small fraction (less than 1%) of the total number of volatile memory portions of the volatile memory block 14, the delay occasioned by looking up each defective volatile memory portion in the remapping table 40 stored in the volatile memory block 14 can be substantial (e.g., 10–12 cycles). As discussed above, one can simply store the entire remapping table 40 in the SRAM cache memory 38 which will reduce the time it takes to look up in the remapping table the non-defective memory portion to which each defective memory portion is mapped. However, because of the higher cost of SRAM compared to DRAM, it is likely to be prohibitively expensive to store the entire remapping table 40 in the SRAM cache memory 38.

Rather than storing the entire remapping table 40 in the cache memory 38, the preferred embodiment of the present invention stores a usage table 44 that maps each of a subset of the defective memory portions of the memory module 12 to a respective one of the non-defective memory portions in the memory module. The defective memory portions of the subset that is mapped in the usage table 44 is selected based on the usage of the defective memory portions during a recent period. As used herein, the term "usage" includes requests made for the defective memory portions. It should be appreciated that the remapping table 40 could map each of the defective memory portions to a respective non-defective memory portion or the remapping table 40 could map only those defective memory portions that are not mapped by the usage table 44.

In the preferred embodiment, the subset of the defective memory portions that are mapped in the usage table 44 includes one or more defective memory portions that have been most recently used. For example, the memory controller processor 36 could keep track of the five most recently requested defective memory portions and store the mappings for those five defective memory portions in the usage table 44. When a defective memory portion is requested that is not one of the five most recently requested defective memory portions, then the usage table 44 is updated by replacing the oldest of the five mappings in the usage table 44 with a mapping for the newly requested defective memory portions.

In an alternate embodiment, the subset of defective memory portions that are mapped in the usage table 44 includes one or more defective memory portions that have been requested most frequently during the recent period. The memory controller processor 36 can keep track of the most frequently requested defective memory portions simply by storing a frequency table that stores a frequency-of-use variable for each of the defective memory portions. Each time one of the defective memory portions is requested, the frequency-of-use variable would be incremented. The memory controller processor 36 then selects whichever of the defective memory portions have the greatest frequency-of-use variable as the most frequently used defective memory portions and stores the mappings for those most frequently used defective memory portions in the usage table 44.

In the preferred embodiment, the memory controller processor 36 stores the usage table 44 in a register array 46 is implemented using very high speed memory, such as a set of flip-flops or a block of SRAM. Storing the usage table 44 in high speed memory enables the memory controller processor 36 to access the non-defective memory portion to which one of the defective memory portions of the usage table 44 is mapped without wasting any memory cycles. In other words, the non-defective memory portion to which one of the defective memory portions is mapped can be accessed using the usage table 44 in the same amount of time that it takes to directly access one of the non-defective memory portions without employing the remapping table 40 or the usage table 44. The memory controller processor 36 can access the non-defective memory portion to which a defective memory portion has been mapped by accessing the usage table 44 during the address decode phase in which the memory controller processor 36 determines that the request received from the processor bus 22 is a memory access request directed to the memory module 12.

In order to enable the memory controller processor 36 to use the usage table 44 to access a non-defective memory portion during the address decode phase, the memory controller processor 36 includes a device address decoder 48 and a usage table controller 44. The device address decoder 48 determines whether the request received from the processor bus 22 is being directed to the memory module 12. The usage table controller 49 determines from the usage table 44 the non-defective memory portion to which one of the defective memory portions in the usage table has been mapped. By including both a device address decoder 48 and usage table logic 49, the memory controller processor 36 simultaneously determines that the request from the processor bus 22 is directed to the memory module 12 and determines the non-defective memory portion to which one of the defective memory portions of the usage table 44 is mapped.

The entire process of creating and storing the error table 18, remapping table 40, and usage table 44 and responding to memory access requests using the error map 18A, remapping table 40, and usage table 44 is transparent to the system processor 24. As a result, there is no need for the software being run by the system processor 24 to be modified in any way to operate in conjunction with the memory module 12 or the memory controller 20 of the preferred embodiment of the present invention.

A flow chart showing the software executed by the processor 36 to remap defective memory locations of the memory module 14 according to a preferred embodiment of the present invention is shown in FIG. 2. In step 50, the defective memory portions of the volatile memory block 14 of the memory module 12 are detected. In step 52, the error map 18 is created which includes an error tag for each of the defective memory portions detected in step 50. In step 54, the error map 18 is stored in the nonvolatile memory block 16 of the memory module 12.

Although the steps 50–54 may be performed by the processor 36 as explained above, they are preferably performed at the facility in which the memory module 12 is manufactured. The memory module 12 then can be incorporated into the computer system 10 by a computer manufacturer or a user desiring to upgrade the computer system 10. However, performing steps 50–54 after the memory module 12 has been incorporated in the computer system 10 enables the error map 18 to be updated to reflect newly defective memory portions of the volatile memory block 14 that have become defective after the memory module 12 has been used as part of the computer system 10. The memory controller processor 36 can determine that a memory portion of the volatile memory block 14 has become defective by writing data to the memory portion and then attempting to read the data from the memory portion. If the data read from the memory portion does not match the data written to the memory portion, then the memory portion is determined to be defective. The memory controller processor 36 then can modify the error map 18 so that the error map indicates that the newly defective memory portion is defective. If it is desired to enable the error map 18 to be so modified, the nonvolatile memory block 16 preferably is an EEPROM or other nonvolatile memory type that can be modified without removing the nonvolatile memory block 16 from the computer system 10.

In response to a user turning ON the computer system 10, in step 56 the copy 18A of the error map 18 is transferred from the nonvolatile memory block 16 to the memory controller 20. In step 58, the error map copy 18A is stored in the cache memory 38. Step 60 determines the location of the non-defective reserved memory region 42 of the volatile memory block 14. In step 62, the remapping table 40 is created which maps the defective memory portions determined in step 50 to non-defective memory portions in the reserved memory region 42 determined in step 58. In step 64, the remapping table created in step 60 is stored in the reserved memory region 42 determined in step 58.

Upon completion of steps 50–64 of FIG. 2, the computer system 10 is ready to respond to requests for access to memory portions of the volatile memory block 14. A flow chart of the software executed by the processor 36 to process a memory access request according to the preferred embodiment of the present invention is shown in FIG. 3. In step 66, a memory access request is received from a memory requester, such as the system processor 24. The memory access request can be a request to write data to or read data from a requested memory portion of the volatile memory block 14. Typically, such a memory access request will include an indication of whether a read or a write is being requested together with an address of the requested memory portion of the volatile memory block 14.

Step 68 determines whether the requested memory portion of the volatile memory block 14 is defective. The memory controller processor 36 performs step 68 by determining whether the error map 18A includes an error tag for the address of the requested memory portion. If the error map 18A indicates that the requested memory portion is defective, then step 70 determines whether the requested memory portion is mapped in the usage table 44. Preferably, the usage table 44 is preloaded to map each of a preselected set of the defective memory portions to a respective non-defective memory portion. Preloading the usage table 44 enables the method to take advantage of the increased speed enabled by storing the usage table 44 in the high-speed register array 46 without waiting for the usage table 44 to be filled based on previous usage of the defective memory portions.

If the requested memory portion is not mapped in the usage table 44, then step 72 accesses the remapping table 40. In step 74, the memory controller processor 36 determines from the remapping table 40 or the usage table 44 (depending on the result of step 70) the remapped memory portion to which the requested memory portion was mapped. In step 76, the usage table 44 is updated to reflect that the requested memory portion is the most recently requested defective memory portion. If the requested memory portion is defective but was not mapped in the usage table 44, then the oldest mapping for the defective memory portion in the usage table 44 that has been least recently used is replaced with a mapping for the requested memory portion. If the requested memory portion was already mapped in the usage table 44, then the usage table is updated merely by indicating that the requested memory portion is the most recent of the most recently used memory portions. In step 78, the remapped memory portion determined in step 74 is accessed. If step 68 determines that the requested memory portion is not defective, then in step 80 the requested memory portion is accessed. In step 82, the operation requested in the memory access request (e.g., read or write operation) is performed.

Based on the foregoing discussion, it will be understood that the preferred embodiment of the invention enables a memory module with defective memory portions to be employed in a computer system without fear of data being lost by attempting to store the data in the defective memory portions. Further, mapping a subset of the defective memory portions in a usage table based on the usage of the defective memory portions enables the preferred embodiment to access much faster the non-defective memory portions to which the defective memory portions are accessed. In addition, the preferred embodiment requires much less memory overhead than prior art error correction schemes that require one or more bits to be added to every data word stored in memory. Moreover, unlike prior art, error corrections schemes that correct only single-bit errors, the preferred embodiment prevents multiple bit errors caused by defective memory portions.

It should be understood that even though numerous advantages of the present invention have been set forth in the foregoing description, the above disclosure is illustrative only. Changes may be made in detail and yet remain within the broad principles of the present invention.

I claim:

1. A method of using a memory controller to interface a memory requester with a memory module having plural defective memory portions and plural non-defective memory portions, the method comprising:

storing a remapping table that maps each of the defective memory portions of the memory module to a respective one of the non-defective memory portions in the memory module;

storing a usage table that maps each of a subset of the defective memory portions of the memory module to a respective one of the non-defective memory portions in the memory module, the defective memory portions of the subset being selected based on usage of the defective memory portions during a recent period;

receiving from the memory requester a request for access to a requested memory portion of the memory module;

determining whether the requested memory portion is one of the subset of defective memory portions that is mapped in the usage table;

determining from the usage table the non-defective memory portion to which the requested memory portion was mapped if the usage table indicates that the requested memory portion is one of the subset of defective memory portions that is mapped in the usage table; and accessing the non-defective memory portion determined from the usage table if the usage table indicates that the requested memory portion is one of the subset of defective memory portions that are mapped in the usage table.

2. The method of claim 1, further comprising determining which of the defective memory portions have been most recently used, the most recently used defective memory portions comprising the subset of defective memory portions that are mapped in the usage table.

3. The method of claim 1 wherein the step of storing the usage table includes storing the usage table in a register array of the memory controller.

4. The method of claim 1 wherein the memory module includes a volatile memory block and a nonvolatile memory block, the memory portions being volatile memory portions of the volatile memory block, method further comprising:

storing in the nonvolatile memory block an error map that identifies the plural defective memory portions of the memory module.

5. The method of claim 4, further comprising:

transferring a copy of the error map from the memory module to the memory controller; and storing the copy of the error map in a cache memory coupled to a processor of the memory controller, wherein the memory controller processor determines from the copy of the error map whether the requested memory portion is one of the defective memory portions.

6. The method of claim 1 wherein the memory module includes a volatile memory block and a nonvolatile memory block, the memory portions being volatile memory portions of the volatile memory block, method further comprising:

storing in the nonvolatile memory block an error map that identifies the plural defective memory portions of the memory module;

transferring a copy of the error map from the memory module to the memory controller after computer system that includes the memory controller and memory module; and using the error map to create the remapping table according to the following substeps:
using the error map to identify a defective memory portion of the memory module;
using the error map to identify a non-defective memory portion of the memory module; and
associating an address of the identified defective memory portion with an address of the identified non-defective memory portion.

7. The method of claim 1 wherein the defective memory portions remapped by the remapping table and usage table are four kilobyte blocks of memory locations in the memory module.

8. The method of claim 1, further comprising:

if the requested memory portion is one of the defective memory portions but is not one of the defective memory portions in the subset; then updating the usage table by replacing a remapping entry for one of the defective memory portions in the subset with a remapping entry of the requested memory portion.

9. A method of controlling a memory module using a memory controller, the method comprising:

determining that a plurality of memory portions of the memory module are defective;

creating a remapping table that maps each of a first set of the plurality of defective memory portions to a respective non-defective memory portion in the memory module so that the non-defective memory portion is accessed when the defective memory portion is requested; and creating a usage table that maps each of a second set of the plurality of defective memory portions of the memory module to a respective non-defective memory portions in the memory module, the defective memory portions of the second set being selected from the plurality of defective memory portions based on usage of the plurality of defective memory portions during a recent period, whereby the remapping table and usage table are employed to satisfy requests for access to the defective memory portions.

10. The method of claim 9 wherein the first set includes all of the plurality of defective memory portions such that the remapping table maps each of the plurality of defective memory portions to a respective non-defective memory portion in the memory module.

11. The method of claim 9, further comprising determining which of the plurality of defective memory portions have been most recently used, the most recently used defective memory portions comprising the second set of defective memory portions that are mapped in the usage table.

12. The method of claim 9, further comprising storing the usage table in a register array of the memory controller.

13. The method of claim 9, further comprising:

receiving from a memory requester a request for access to a requested memory portion of the memory module;

determining whether the requested memory portion is one of the defective memory portions of the second set that is mapped in the usage table;

determining from the usage table the non-defective memory portion to which the requested memory portion was mapped if the usage table indicates that the requested memory portion is one of the second set of defective memory portions that is mapped in the usage table; and accessing the non-defective memory portion determined from the usage table if the usage table indicates that the requested memory portion is one of the second set of defective memory portions that are mapped in the usage table.

14. The method of claim 9, further comprising:

storing an error map that identifies the plural defective memory portions of the memory module;

receiving from a memory requester a request for access to a requested memory portion of the memory module;

determining from the error map whether the requested memory portion is one of the defective memory portions;

if the error map indicates that the requested memory portion is one of the defective memory portions, then determining whether the requested memory portion is one of the defective memory portions of the second set that is mapped in the usage table;

determining from the usage table the non-defective memory portion to which the requested memory portion was mapped if the usage table indicates that the requested memory portion is one of the second set of defective memory portions that is mapped in the usage table; and accessing the non-defective memory portion determined from the usage table if the usage table indicates that the requested memory portion is one of the second set of defective memory portions that are mapped in the usage table.

15. The method of claim 14, further comprising:

if the usage table indicates that the requested memory portion is one of the second set of defective memory portions that is mapped in the usage table, then determining whether the requested memory portion is the most recently used memory portion in the second set; and if requested memory portion is one of the second set or defective memory portions but is not the most recently used memory portion in the second set, then updating the usage table to indicate that the requested memory portion is the most recently used memory portion in the second set.

16. The method of claim 14, further comprising:
if the error table indicates that the requested memory portion is one of the defective memory portions but is not one of the defective memory portions of the second set, then determining from the remapping table the non-defective memory portion to which the requested memory portion was mapped;
accessing the non-defective memory portion determined from the remapping table; and
updating the usage table to indicate that the requested memory portion is the most recently used memory portion.

17. A computer system for servicing a current memory access request from a memory requester, comprising:
a memory module having a plurality of memory portions, at least one of the memory portions being defective and one of the memory portions being requested by the current memory access request; and
a remapping table that maps each of a first set of the plurality of defective memory portions to a respective non-defective memory portion in the memory module so that the non-defective memory portion is accessed when the defective memory portion is requested;
a usage table that maps each of a second set of the plurality of defective memory portions of the memory module to a respective non-defective memory portions in the memory module, the defective memory portions of the second set being selected from the plurality of defective memory portions based on usage of the plurality of defective memory portions during a recent period; and
a request processor coupled to the memory module, remapping table, and usage table, the request processor being structured to determine whether the requested memory portion is defective, and if the requested memory portion is defective, determine from either the remapping table or the usage table the non-defective memory portion to which the requested memory portion has been mapped, and direct the memory access request to the nondefective memory portion determined rather than to the requested memory portion.

18. The computer system of claim 17 wherein the usage table is stored on a memory controller that includes the request processor and the remapping table is stored on the memory module.

19. The computer system of claim 17 wherein the first set includes all of the plurality of defective memory portions such that the remapping table maps each of the plurality of defective memory portions to a respective non-defective memory portion in the memory module.

20. The computer system of claim 17 wherein the second set stored in the usage table includes a remapping entry for whichever defective memory portion has been most recently requested prior to the current memory access request.

21. The computer system of claim 17, further comprising:
an error map having an error tag for each of the defective memory portions, the error tag indicating that the memory portion is defective, wherein the request processor is structured to determine from the error map whether the requested memory portion is defective.

22. The computer system of claim 17 wherein:
the memory module includes:
a volatile memory block that includes the defective memory portions and the non-defective memory portions to which the defective memory portions are mapped by the remapping table and the usage table; and
a non-volatile memory block that stores an error map having an error tag for each of the defective memory portions, the error tag indicating that the memory portion is defective; and
the request processor includes:
means for creating the remapping table from the error map in response to turning ON the computer system; and
means for creating the usage table from the remapping table based on the usage of the defective memory portions.

23. A memory controller for servicing a current memory access request directed from a memory requester to a memory module having a plurality of defective memory portions and a plurality of non-defective memory portions, the memory controller comprising:
a usage table that maps each of a subset of the plurality of defective memory portions to a respective one of the plurality of non-defective memory portions, the defective memory portions in the subset being selected based on usage of the defective memory portions during a recent period;
a request processor coupled to the usage table, the request processor being structured to determine whether the requested memory portion is defective, determine from the usage table whether the requested memory portion is mapped in the usage table if the requested memory portion is defective, determine the non-defective memory portion to which the requested memory portion is mapped, and direct the memory access request to the non-defective memory portion determined rather than to the requested memory portion.

24. The memory controller of claim 23, further comprising:
a device address decoder that determines from the memory access request that the memory module is being requested, wherein the request processor is structured to determine from the usage table the non-defective memory portion to which the requested memory portion is mapped while the device address decoder determines from the memory access request that the memory module is being requested such that no clock cycles are lost in determining the non-defective memory portion to which the requested memory portion is mapped.

25. The memory controller of claim 23, further comprising:
an error map having an error tag for each of the defective memory portions, the error tag indicating that the memory portion is defective, wherein the request processor is structured to determine from the error map whether the requested memory portion is defective.

* * * * *